(12) United States Patent
Nagao

(10) Patent No.: US 8,402,639 B2
(45) Date of Patent: *Mar. 26, 2013

(54) ELECTRONIC COMPONENT MOUNTING SYSTEM

(75) Inventor: Kazuhide Nagao, Yamanashi (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/056,176

(22) PCT Filed: Sep. 29, 2009

(86) PCT No.: PCT/JP2009/005012
§ 371 (c)(1),
(2), (4) Date: Jan. 27, 2011

(87) PCT Pub. No.: WO2010/038440
PCT Pub. Date: Apr. 8, 2010

(65) Prior Publication Data
US 2011/0197437 A1    Aug. 18, 2011

(30) Foreign Application Priority Data
Oct. 3, 2008 (JP) .............................. P2008-258142

(51) Int. Cl.
B23P 19/00 (2006.01)
(52) U.S. Cl. ................ 29/740; 29/741; 29/742; 29/759; 29/840
(58) Field of Classification Search .................... 29/729, 29/739–743, 840, 805, 820–821; 414/737, 414/752
See application file for complete search history.

(56) References Cited

U.S. PATENT DOCUMENTS

| | | | |
|---|---|---|---|
| 5,495,661 A * | 3/1996 | Gromer et al. ................. | 29/740 |
| 6,378,200 B1 * | 4/2002 | Lim et al. ....................... | 29/832 |
| 6,964,093 B2 * | 11/2005 | Mochida et al. ............... | 29/742 |
| 6,971,158 B2 * | 12/2005 | Terui .............................. | 29/740 |
| 7,010,853 B2 * | 3/2006 | Oe ................................... | 29/740 |
| 7,222,413 B2 * | 5/2007 | Hamasaki et al. ............. | 29/740 |
| 7,578,054 B2 * | 8/2009 | Komiya et al. ................ | 29/740 |
| 2002/0073537 A1 | 6/2002 | Sumi | |
| 2011/0179638 A1 * | 7/2011 | Nagao ........................... | 29/729 |

FOREIGN PATENT DOCUMENTS

| | | |
|---|---|---|
| JP | 07-321492 A | 12/1995 |
| JP | 08-032225 A | 2/1996 |
| JP | 2002057492 A | 2/2002 |
| JP | 2002-328100 A | 11/2002 |
| JP | 2003-204191 A | 7/2003 |
| JP | 2004304168 A | 10/2004 |
| JP | 2005-081745 A | 3/2005 |

OTHER PUBLICATIONS

International Search Report for PCT/JP2009/005012 dated Oct. 27, 2009.

* cited by examiner

Primary Examiner — Minh Trinh
(74) Attorney, Agent, or Firm — Pearne & Gordon LLP

(57) ABSTRACT

It is an object to provide an electronic component mounting system capable of concurrently, efficiently subjecting a plurality of substrates to component mounting operation and accomplishing both high productivity and a capability of addressing production of multiple products. An electronic component mounting system is configured by arranging, on an upstream side of a component loading unit having a plurality of substrate conveyance mechanisms, a screen printer M2 having a plurality of individual printing mechanisms and a coating and inspection machine M4 that applies a coat of a resin for use in boding an electronic component and that inspects a coated state. The coating and inspection machine M4 is equipped with a coating head 15 that performs operation for coating substrates conveyed by substrate conveyance mechanisms 12A and 12B from the screen printer M2 with the resin and an inspection head 16 that performs pre-coating inspection and post-coating inspection.

2 Claims, 14 Drawing Sheets

ELECTRONIC COMPONENT MOUNTING SYSTEM

TECHNICAL FIELD

The present invention relates to an electronic component mounting system that manufactures a mounting substrate by mounting electronic components on a substrate.

BACKGROUND ART

An electronic component mounting system that manufactures a mounting substrate by mounting electronic components on a substrate has an electronic component mounting line configured by linking together a screen printer that prints solder paste on electronic components, an electronic component loader that loads the electronic components on a printed substrate (see; for instance, Patent Document 1). An example of the related art described in connection with the Patent Document shows a structure including the screen printer, the electronic component loader, and a reflow machine together that are linked together in series.

RELATED-ART DOCUMENT

Patent Document

Patent Document 1: Japanese Patent No. 3562450

SUMMARY OF THE INVENTION

Problem that the Invention is to Solve

Diversification of production style has recently advanced in the electronic industry, and a style of switching, as required, between related-art mass production of one type of product and producing multiple products in small quantities is about to go mainstream. For instance, a mounting line for producing circuit boards for use in portable telephones, and the like, is required to carry out mass production of a newly-released, well-selling, preferred model in a short period of time so as to respond to a surge in demand. On the contrary, in relation to a model that has a superior characteristic in terms of a function or a design and that has attained entrenched popularity among specific customer strata, portable phones of those models must continually be produced in small quantities over a long period of time. Such models often cover a wide variety of types, and hence there is no alternative way but to adopt a style of producing products of multiple models in small quantities that involves frequent switching among models.

In order to address such diversification of a demand, a production site has been requested to switch, as required, between mass production of one type of product and producing multiple products in small quantities, according to a demand forecast and an order situation acquired on each occasion. Specifically, a plurality of all-purpose electronic component mounting lines are installed, and types of substrates to be produced are sorted into the lines according to constantly-updated output schedules. However, the related-art electronic component mounting facilities, including the example described in connection with the Patent Document, are not configured so as to be able to efficiently respond to such a production style mixedly including mass production of one type of product and producing multiple products in small quantities, and it has been difficult to pursue both high productivity and the capability of addressing production of multiple products.

Accordingly, the present invention aims at providing an electronic component mounting system that enables concurrent, efficient performance of operation for mounting electronic components on a plurality of substrates and pursuit of both high productivity and a capability of addressing production of multiple products.

Means for Solving the Problem

An electronic component mounting system of the present invention is an electronic component mounting system including, on an upstream side of a component loading unit for mounting electronic components on a substrate, a screen printing unit for printing paste for use in bonding the electronic components on the substrate and a coating and inspection unit that applies a coat of resin for use in bonding electronic components and that inspects a pre-coating state and a post-coating state, the system comprising:

a plurality of individual printing mechanisms that are provided in the screen printing unit, that can independently perform printing operation under separate control, and that can separately perform tooling change operation incidental to switching of a type of a substrate subject to printing;

a plurality of substrate conveyance mechanisms, a coating operation mechanism, and an inspection processing unit that are provided in the coating and inspection unit, the plurality of substrate conveyance mechanisms respectively conveying printed substrates carried out of the plurality of individual printing mechanisms, the coating operation mechanism subjecting the plurality of substrates conveyed by the plurality of substrate conveyance mechanisms to the resin coating operation, and the inspection processing unit subjecting yet-to-be-coated substrates and/or coated substrates to pre-coating inspection and/or post-coating inspection; and a plurality of substrate conveyance mechanisms and a plurality of component loading mechanisms that are provided in the component loading unit, the plurality of the substrate conveyance mechanisms respectively conveying the plurality of substrates delivered from the coating and inspection unit and the plurality of component loading mechanisms subjecting a plurality of substrates conveyed by the plurality of substrate conveyance mechanisms to component loading operation, wherein a plurality of individual mounting lanes, each of which is built by combination of a corresponding individual printing mechanism of the plurality of individual printing mechanism, a corresponding substrate conveyance mechanism of the plurality of substrate conveyance mechanisms, and a corresponding component loading mechanism of the plurality of component loading mechanisms, are activated, to thus concurrently subject a plurality of substrates to component mounting operation.

Advantage of the Invention

According to the present invention, an electronic component mounting system is configured by arranging, on an upstream side of a component loading unit having a plurality of substrate conveyance mechanisms, a screen printing unit having a plurality of individual printing mechanisms and a coating and inspection unit that applies a coat of a resin for use in boding an electronic component and that inspects a coated state. The system includes a plurality of substrate conveyance mechanisms, a coating operation mechanism, and an inspection processing unit that are provided in the coating and inspection unit, the plurality of substrate conveyance mechanisms respectively conveying printed substrates carried out of the plurality of individual printing mechanisms, the coating operation mechanism subjecting the substrates conveyed by the plurality of substrate conveyance mechanisms to the resin coating operation, and the inspection processing unit subjecting yet-to-be-coated substrates and/or coated substrates to pre-coating inspection and/or post-coating inspection. It becomes possible for a single electronic component mounting line to select, as required, an appropriate production style from mass production of one type of product and producing multiple products in small quantities. Thus, accomplishment of both high productivity and a capability of addressing production of multiple products becomes feasible.

BEST MODE FOR IMPLEMENTING THE INVENTION

Figure 1:
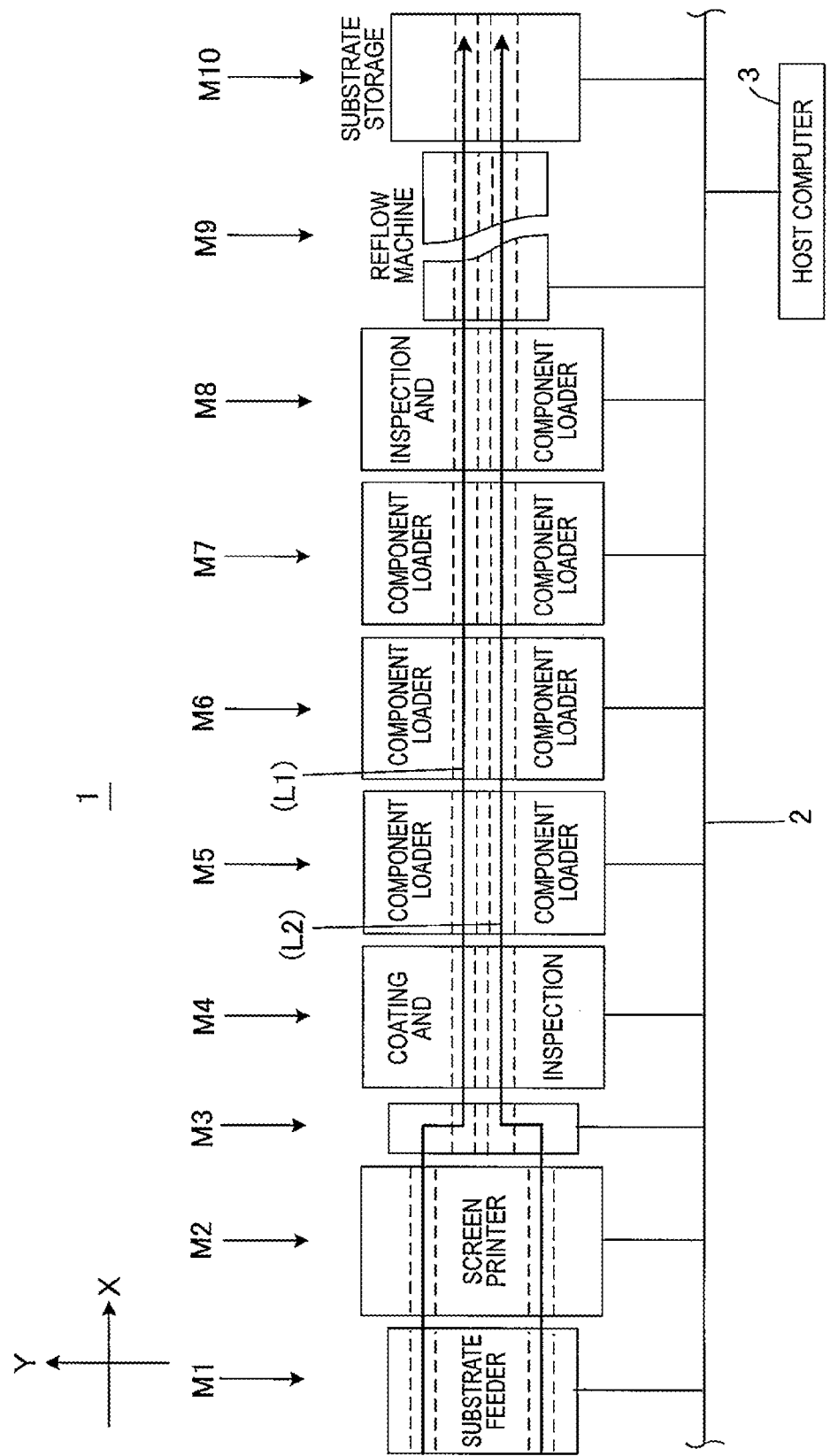
FIG. 1 It is a descriptive block diagram of an electronic component mounting system of an embodiment of the present invention.
Figure 2:
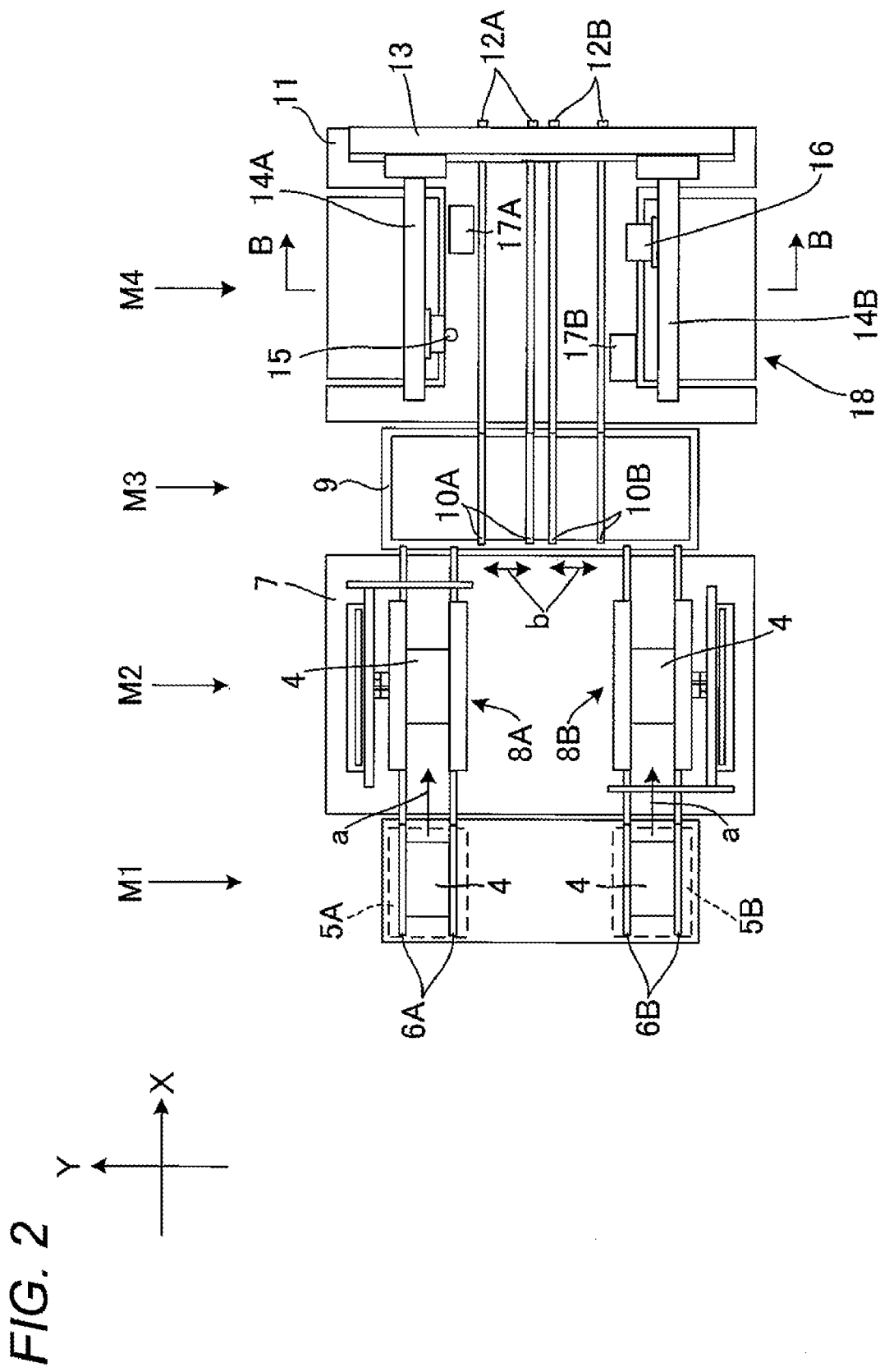
FIG. 2 It is a partial plan view of the electronic component mounting system of the embodiment of the present invention.
Figure 3:
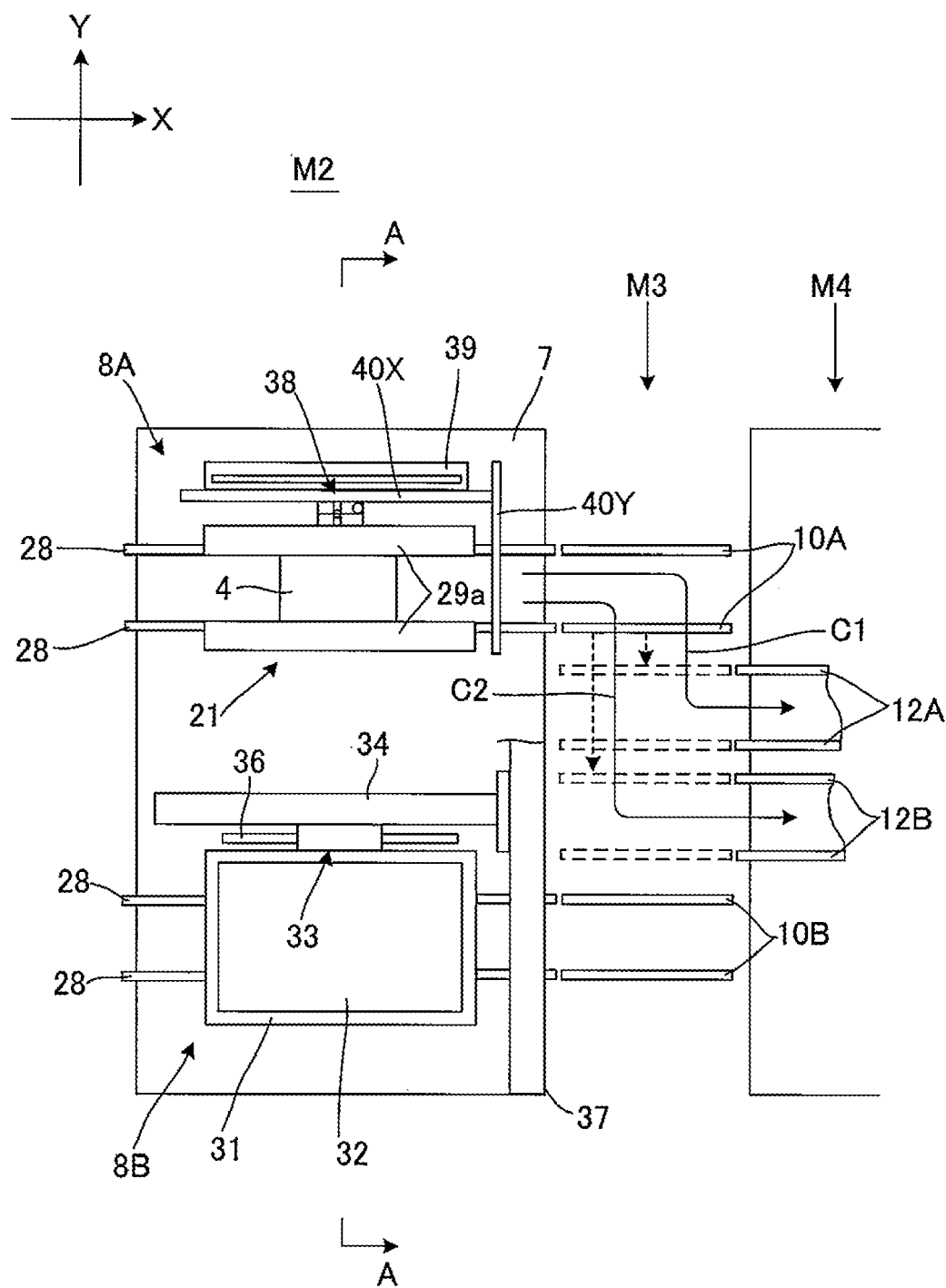
FIG. 3 It is a plan view of a screen printer in the electronic component mounting system of the embodiment of the present invention.
Figure 4:
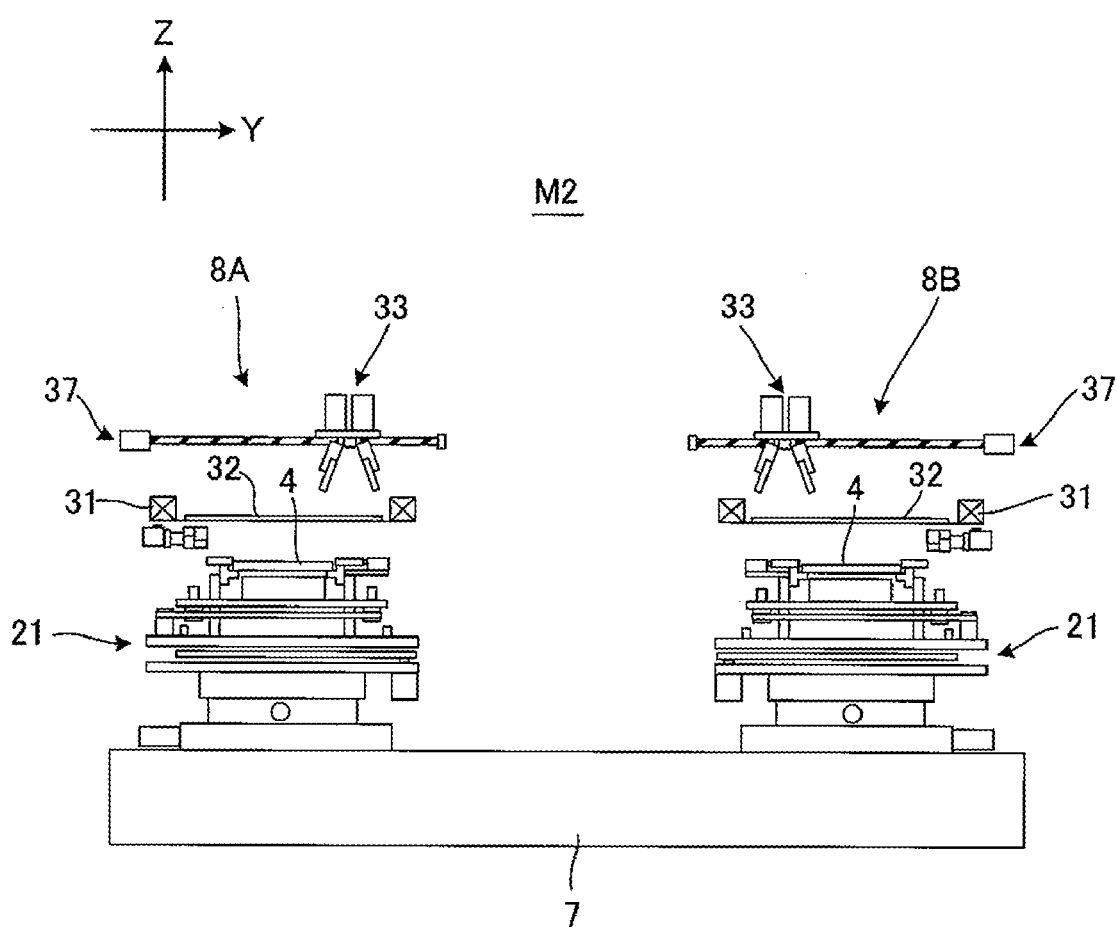
FIG. 4 It is a cross sectional view of the screen printer in the electronic component mounting system of the embodiment of the present invention.
Figure 5:
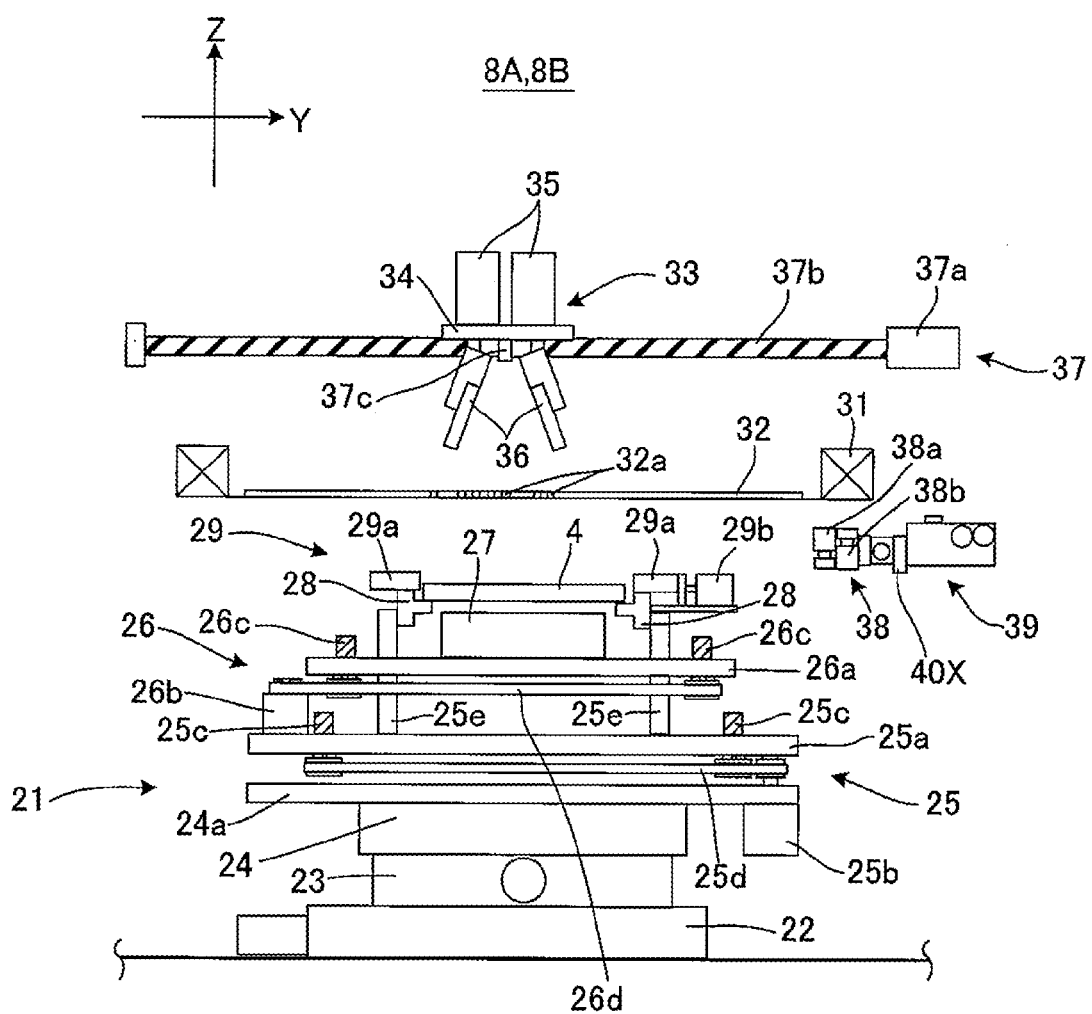
FIG. 5 It is a cross sectional view of the screen printer in the electronic component mounting system of the embodiment of the present invention.
Figure 6:
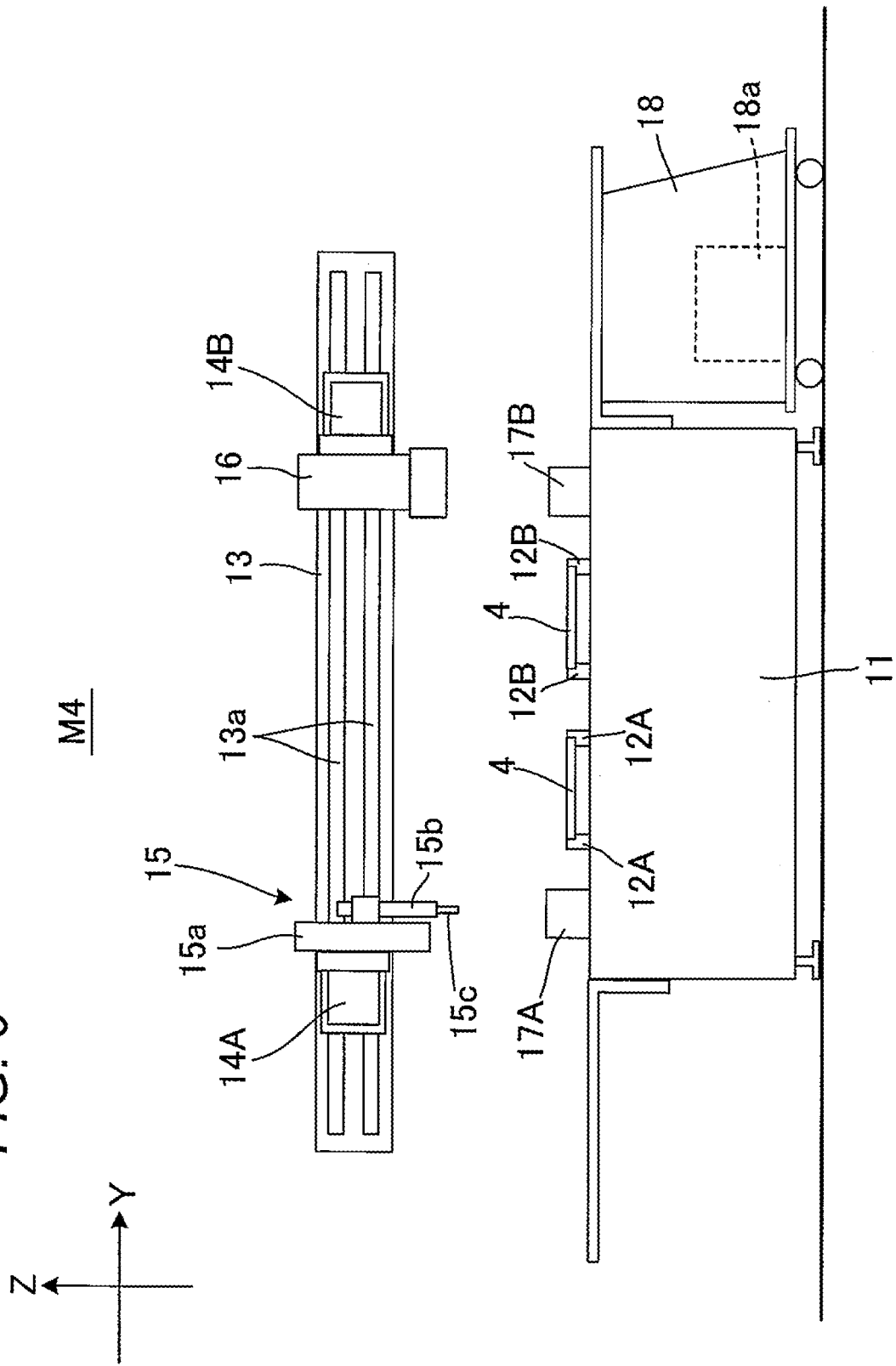
FIG. 6 It is a cross sectional view of a coating and inspection machine in the electronic component mounting system of the embodiment of the present invention.
Figure 8:
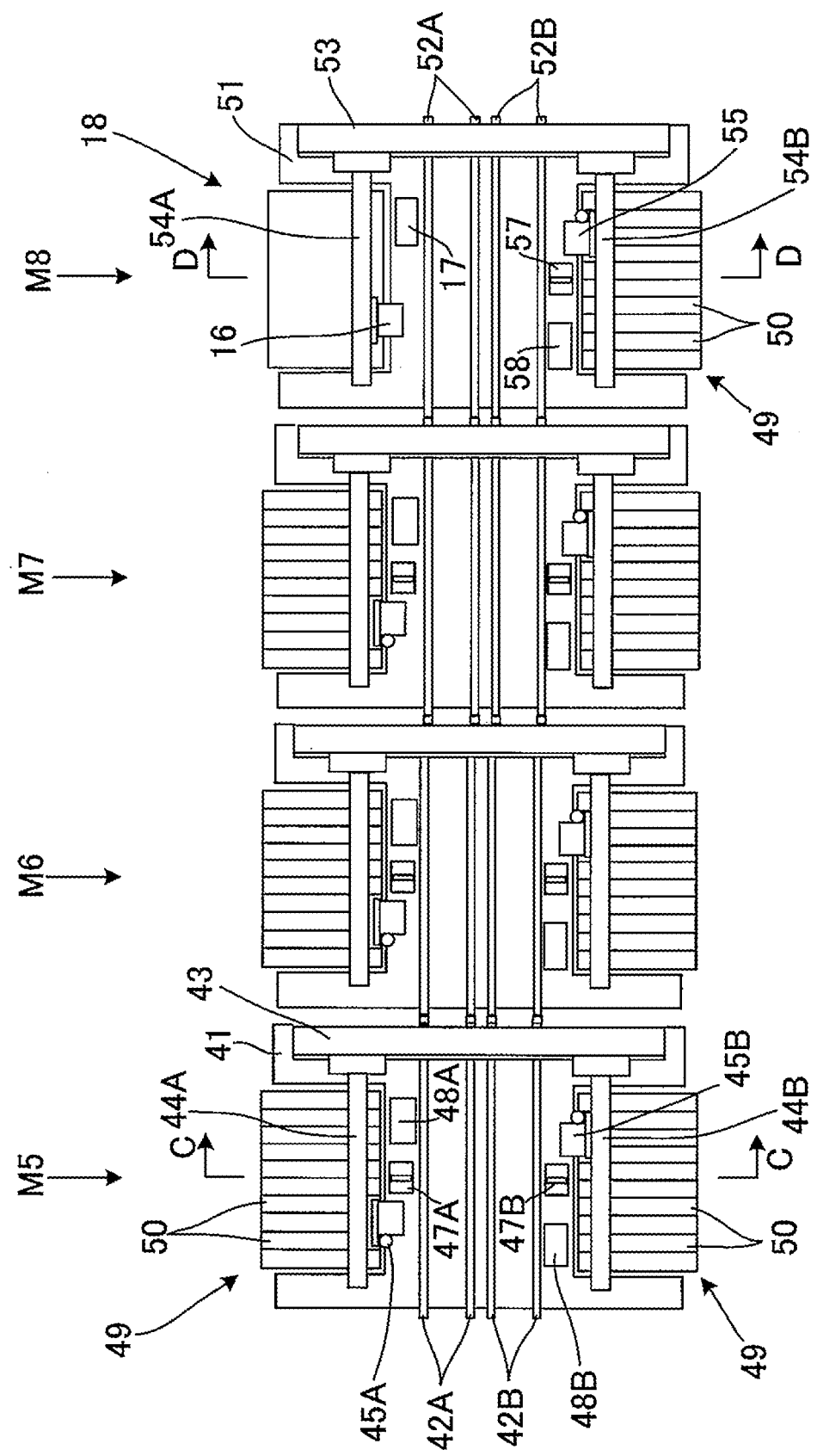
FIG. 8 It is a partial plan view of the electronic component mounting system of the embodiment of the present invention.
Figure 9:
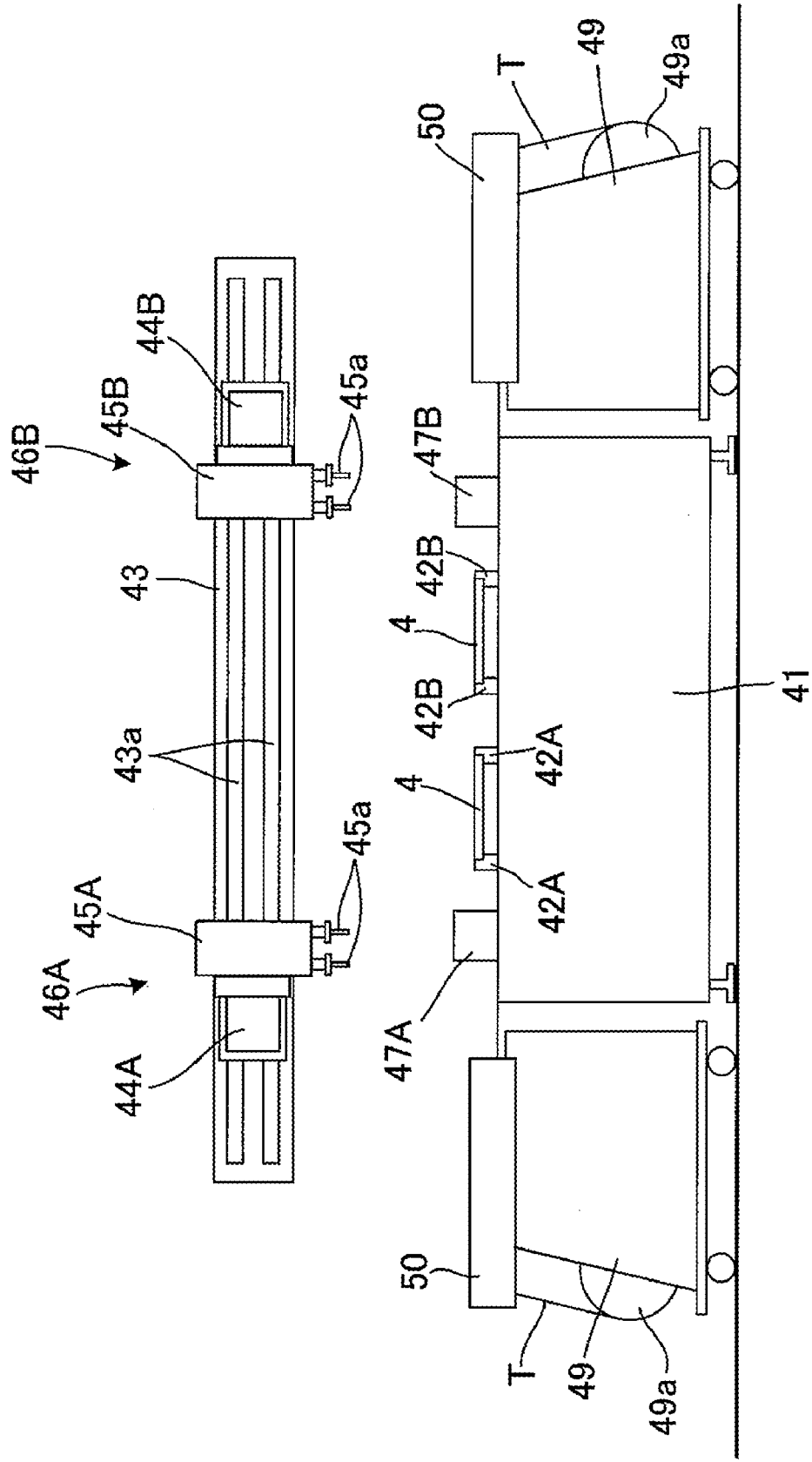
FIG. 9 It is a cross sectional view of an electronic component loader in the electronic component mounting system of the embodiment of the present invention.
Figure 10:
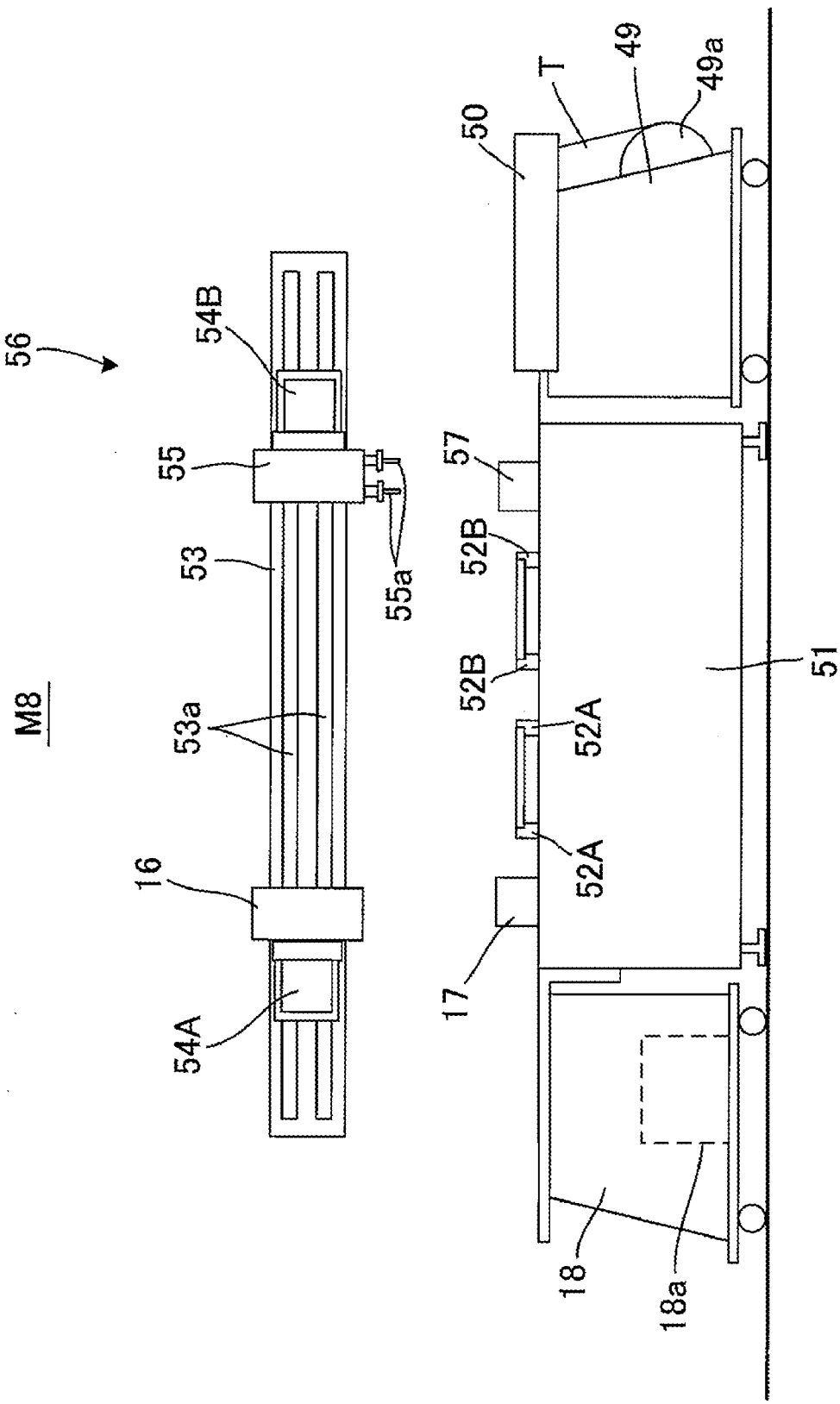
FIG. 10 It is a cross sectional view of a loading and inspection machine in the electronic component mounting system of the embodiment of the present invention.
Figure 11:
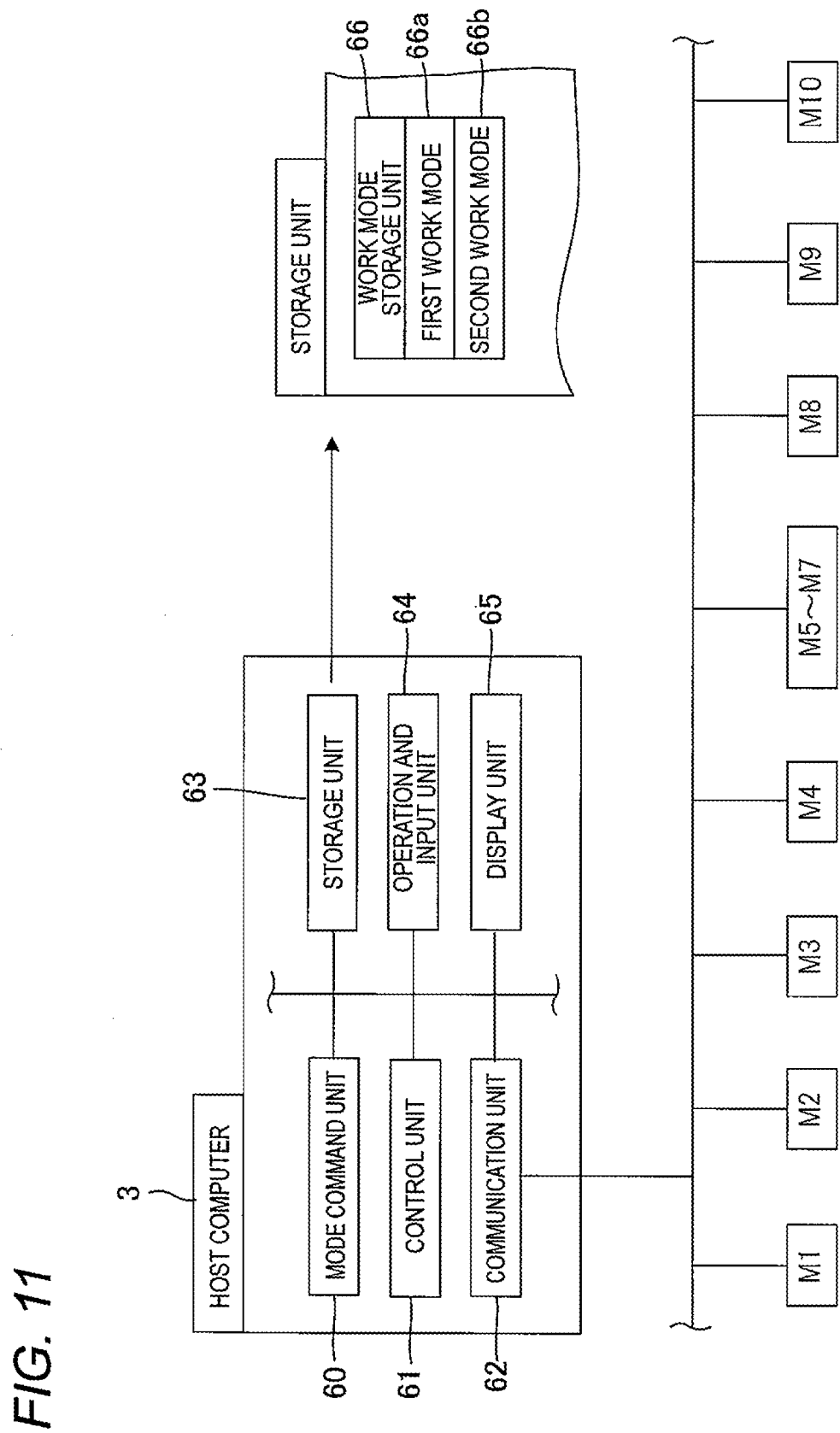
FIG. 11 It is a block diagram showing a configuration of a control system of the electronic component mounting system of the embodiment of the present invention.
Figure 12:
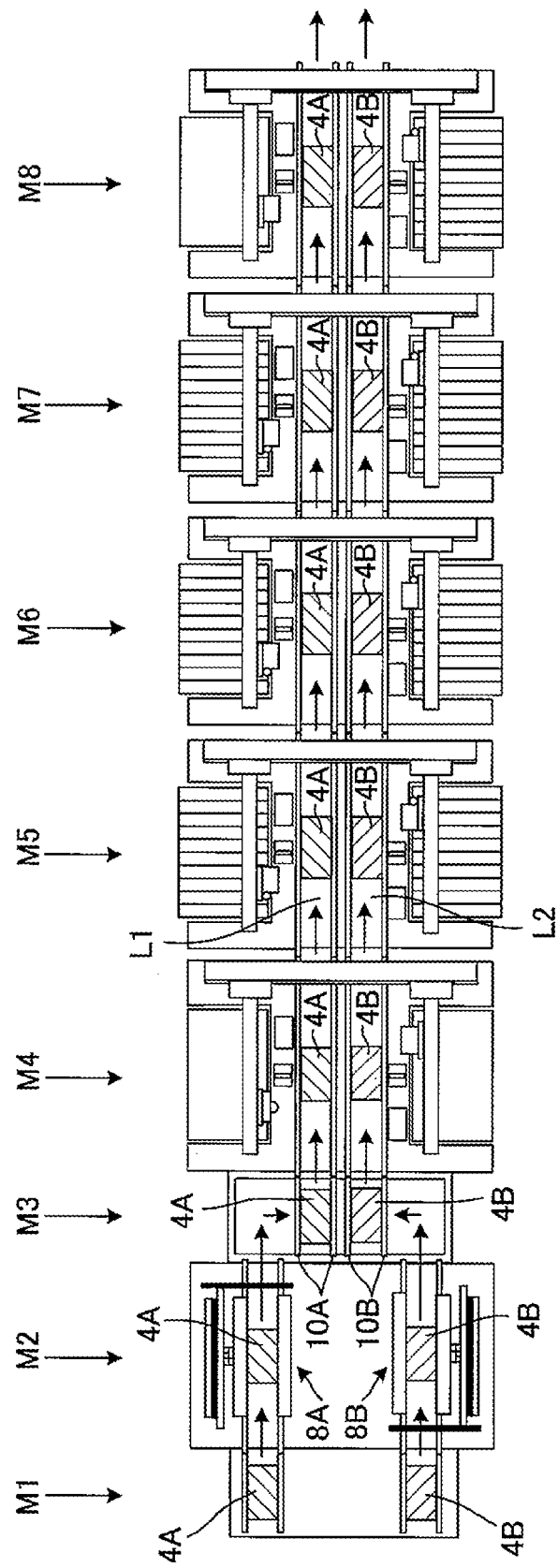
FIG. 12 It is a descriptive operation diagram of the electronic component mounting system of the embodiment of the present invention.
Figure 13:
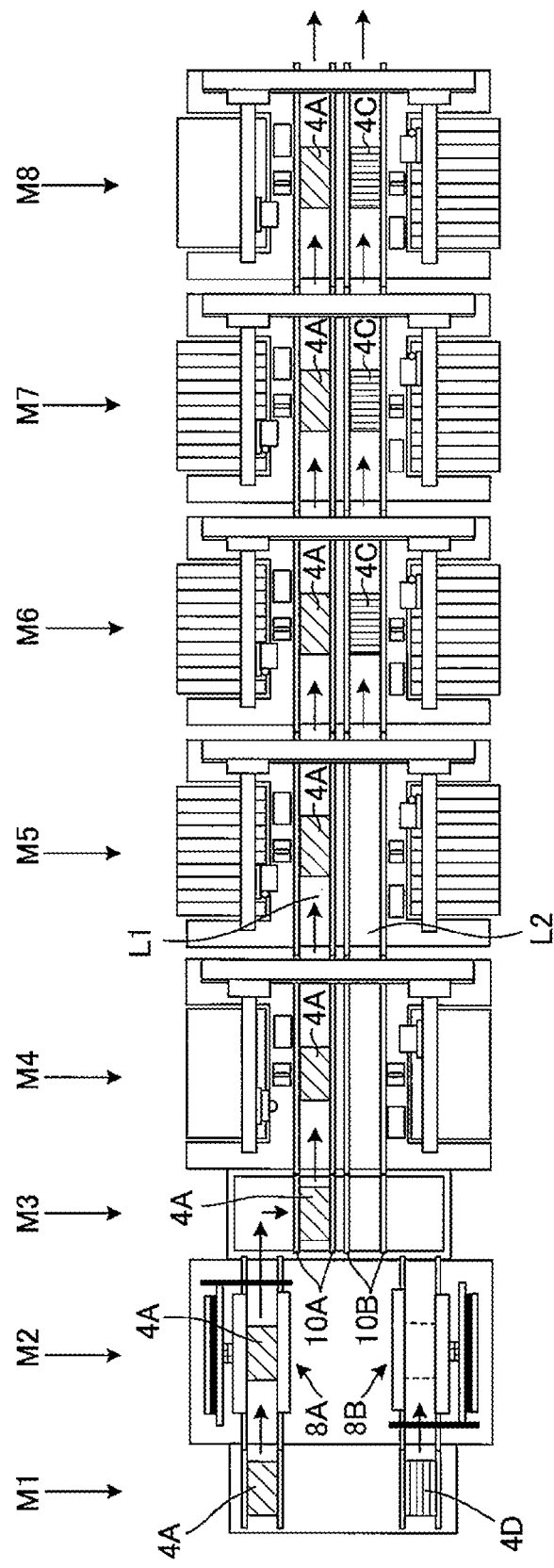
FIG. 13 It is a descriptive operation diagram of the electronic component mounting system of the embodiment of the present invention.
Figure 14:
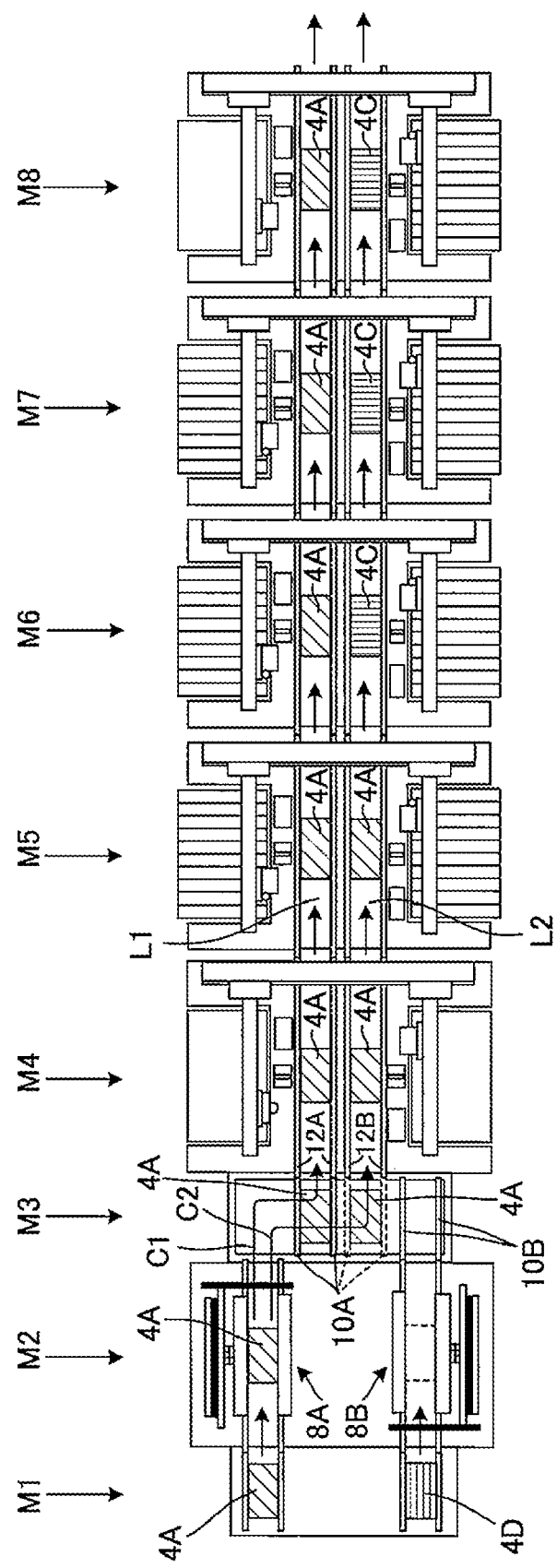
FIG. 14 It is a descriptive operation diagram of the electronic component mounting system of the embodiment of the present invention.

An embodiment of the present invention is now described by reference to the drawings. FIG. 1 is a descriptive block diagram of an electronic component mounting system of an embodiment of the present invention; FIG. 2 is a partial plan view of the electronic component mounting system of the embodiment of the present invention; FIG. 3 is a plan view of a screen printer in the electronic component mounting system of the embodiment of the present invention; FIGS. 4 and 5 are cross sectional views of the screen printer in the electronic component mounting system of the embodiment of the present invention; FIG. 6 is a cross sectional view of a coating and inspection machine in the electronic component mounting system of the embodiment of the present invention; FIGS. 7(a) to (c) are descriptive operation diagrams of the coating and inspection machine in the electronic component mounting system of the embodiment of the present invention; FIG. 8 is a partial plan view of the electronic component mounting system of the embodiment of the present invention; FIG. 9 is a cross sectional view of an electronic component loader in the electronic component mounting system of the embodiment of the present invention; FIG. 10 is a cross sectional view of a loading and inspection machine in the electronic component mounting system of the embodiment of the present invention; FIG. 11 is a block diagram showing a configuration of a control system of the electronic component mounting system of the embodiment of the present invention; and FIGS. 12, 13, and 14 are descriptive operation diagrams of the electronic component mounting system of the embodiment of the present invention.

First, the configuration of the electronic component mounting system is described by reference to FIG. 1. An electronic component mounting line 1 making up the electronic component mounting system has a function of manufacturing a mounting substrate on which electronic components are mounted and is built by linking, in this sequence from an upstream side (a left side of FIG. 1), many machines; namely, a substrate feeder M1, a screen printer M2, a substrate sorter M3, a coating and inspection machine M4, electronic component loaders M5, M6, and M7, a loading and inspection machine M8, a reflow machine M9, and a substrate recovery machine M10 in line along direction of conveyance of a substrate (a direction X). These machines are respectively connected to a host computer 3 by way of a LAN system 2, and the host computer 3 controls overall component mounting operations performed by the respective machines of the electronic component mounting line 1.

A substrate fed from the substrate feeder M1 located at the most upstream position is conveyed to the screen printer M2, where cream solder that is paste for use in bonding an electronic component is printed on the substrate. Next, the substrate sorter M3 sends the substrate to the coating and inspection machine M4, where the substrate undergoes coating of a resin for use in bonding an electronic component and coating inspection. The electronic component loaders M5, M6, and M7 load electronic components on the thus-inspected substrate. Further, the loading and inspection machine M8 loads electronic components and inspects loaded electronic components. The inspected substrate is carried into the reflow machine M9. The substrate subjected to component loading operation is heated, to thus heat the cream solder and solder-bond the electronic components to the substrate. The substrate subjected to solder bonding is recovered by and stored in the substrate recovery machine M10.

In the configuration, the screen printer M2 makes up a screen printing unit that prints on a substrate the paste for use in bonding an electronic component. The electronic component loaders M5, M6, and M7 make up a component loading unit that loads electronic components on a substrate. The coating and inspection machine M4 makes up a coating and inspection unit that applies a coat of the resin for use in bonding an electronic component and that inspects a state achieved before and after coating operation. Specifically, the electronic component mounting line 1 makes up an electronic component mounting system built by arranging, upstream of the component loading unit that loads electronic components on the substrate, the screen printing unit that prints on the substrate the paste for use in bonding an electronic component and the coating and inspection unit that applies the coat of the resin for use in bonding an electronic component and that inspects a state achieved before and after the coating operation.

Each of the machines; namely, the substrate feeder M1 to the substrate recovery machine M10, separately has two rows of substrate conveyance mechanisms. In each of the machines, each of the substrate conveyance mechanisms is assigned working mechanisms, such as an individual printing mechanism for performing screen printing and a component loading mechanism. Therefore, in each of the machines, a corresponding working mechanism can concurrently subject a substrate conveyed by each of the substrate conveyance mechanisms to work for mounting components.

A substrate conveyance lane built by linking the substrate conveyance mechanisms in the respective machines together is combined with the corresponding individual printing mechanism and the corresponding component loading mechanism, thereby building up a mounting lane for subjecting a substrate to mounting operation while conveying the substrate. In the electronic component mounting line 1 shown in the embodiment, each of the machines has two substrate conveyance mechanisms. Hence, two individual mounting lanes L1 and L2 are formed. The electronic component mounting system 1 specifically assumes a style of concurrently subjecting a plurality of substrates to component mounting operation by activating a plurality of individual mounting lanes, each of which is built by combining together a corresponding individual printing mechanism, a corresponding substrate conveyance mechanism, and a corresponding component loading mechanism among the plurality of individual printing mechanisms, the plurality of substrate conveyance mechanisms, and the plurality of component loading mechanisms.

A structure of each of the machines making up the electronic component mounting line 1 is hereunder described. First, the substrate feeder M1 to the coating and inspection machines M4 are described by reference to FIGS. 2 through 7. In FIG. 2, the substrate feeder M1 is configured such that a first substrate feeding conveyor 6A is arranged above a first substrate feeding mechanism 5A housing substrates 4 in a direction of feeding of a substrate and that a second substrate feeding conveyor 6B is arranged above a second substrate feeding mechanism 5B housing the substrates 4 in a direction of feeding of a substrate. The first substrate feeding conveyor 6A and the second substrate feeding conveyor 6B are connected to respective substrate transport conveyors 28 (see FIG. 3) of the adjacent, downstream screen printer M2. The substrates 4 taken out of the first substrate feeding mechanism 5A and the second substrate feeding mechanism 5B are fed (as indicated by an arrow "a") to the substrate transport conveyors 28 of the screen printer M2 by means of the first substrate feeding conveyor 6A and the second substrate feeding conveyor 6B.

The substrate sorter M3 is adjacently disposed on a downstream side of the screen printer M2. The sorter is configured such that a first substrate sorting conveyor 10A and a second substrate sorting conveyor 10B are placed on an upper surface of the base 9 so as to be movable in a direction Y. The substrates 4 subjected to printing by the screen printer M2 are sent to the coating and inspection machine M4 by way of the substrate sorter M3. The substrate sorter M3 serving as a constituent element of the electronic component mounting line 1 may be a stand-along machine as illustrated or a substrate sorting section adjunctively provided for the screen printer M2.

A structure of the screen printer M2 is now described by reference to FIGS. 3, 4, and 5. FIG. 4 shows a cross section viewed in a direction A-A shown in FIG. 3, and FIG. 5 is a detailed cross sectional view for describing a structure of a first individual printing mechanism 8A and a structure of a second individual printing mechanism 8B. The screen printer M2 is configured such that a first individual printing mechanism 8A and a second individual printing mechanism 8B, which each has a function of printing solder paste on a substrate and which each can independently perform printing operation under separate control, are symmetrically arranged side by side on a base 7. Each of the first individual printing mechanism 8A and the second individual printing mechanism 8B is provided with a substrate positioning unit 21 for positioning and holding the substrate 4 at a print position. A mask plate 32 having a pattern aperture and a squeegee moving mechanism 37 that slidably moves a squeegee 36 (see FIG. 5) of a squeegee unit 33 over the mask plate 32 supplied with paste are disposed above the substrate position unit 21. The mask plate 32, the squeegee unit 33, and the squeegee moving mechanism 37 make up a screen printing mechanism that print paste on the substrate 4.

A detailed structure of the substrate positioning unit 21, that of the squeegee unit 33, and that of the squeegee moving mechanism 37 are described by reference to FIG. 5. In FIG. 5, the substrate positioning unit 21 is built by stacking, in this sequence from below, a Y axis table 22, an X axis table 23, and a θ axis table 24 into layers, and additionally placing, in this sequence from below, a first Z axis table 25 and a second Z axis table 26, on the θ axis table 24 in combination. The structure of the first Z axis table 25 is described. A horizontal base plate 24a is placed on an upper surface of the θ axis table 24, and a similarly, horizontal base plate 25a is held on an upper surface side of the base plate 24a in a vertically movable fashion by an elevation guide mechanism (omitted from the drawing). The base plate 25a is moved up and down by means of a Z axis elevation mechanism that is structured so as to rotationally drive a plurality of feed screws 25c by means of a substrate moving Z axis motor 25b by way of a belt 25d. Two vertical frames 25e stand upright on the base plate 25a. A pair of substrate transport conveyors 28 are held on upper ends of the respective vertical frames 25e.

The substrate transport conveyors 28 are disposed in parallel with the direction of transport of a substrate (the X direction—a direction perpendicular to a drawing sheet of FIG. 5). The substrate 4 subject to printing is conveyed while both ends of the substrate are supported by the substrate transport conveyors 28. By actuation of the first Z axis table 25, the substrate 4 held by the substrate transport conveyors 28 can be moved up and down with reference to the screen printing mechanism along with the substrate transport conveyors 28.

A structure of the second Z axis table 26 is described. A horizontal base plate 26a is interposed between the substrate transport conveyor 28 and the base plate 25a so as to be vertically movable along the elevation guide mechanism (omitted from the drawing). The base plate 26a is moved up and down by means of the Z axis elevation mechanism that is structured so as to rotationally drive a plurality of feed screws 26c by means of a lower support elevation motor 26b by way of a belt 26d. A substrate lower support unit 27 is removably placed on an upper surface of the base plate 26a. The substrate lower support unit 27 supports from below and holds the substrate 4 conveyed to a print position by the screen printing mechanism.

During printing operations performed by the first individual printing mechanism 8A and the second individual printing mechanism 8B, the respective substrate transport conveyors 28 receive the substrate 4 fed from the substrate feeder M1 by way of the first substrate feeding conveyor 6A and the second substrate feeding conveyor 6B; caries the thus-received substrate to the print position for the screen printing mechanism; and maintains the substrate at that position. The substrate 4 subjected to printing by the screen printing mechanism is carried out from the print position by means of the substrate transport conveyors 28 and delivered to the first sorting conveyor 10A and the second sorting conveyor 10B of the substrate sorter M3.

As a result of actuation of the second Z axis table 26, the substrate lower support unit 27 moves up and down with respect to the substrate 4 held by the substrate transport conveyors 28. A lower support surface of the substrate lower support unit 27 comes into contact with a lower surface of the substrate 4, whereupon the substrate lower support unit 27 supports the substrate 4 from its lower surface side. A clamping mechanism 29 is disposed on respective upper surfaces of the substrate transport conveyors 28. The clamping mechanism 29 has two clamping members 29a arranged so as to laterally oppose each other. One of the clamping members 29a is moved forward and backward by a drive mechanism 29b, whereby both sides of the substrate 4 are securely clamped.

There is now described a structure of the screen printing mechanism that is disposed above the substrate positioning unit 21 and that prints paste on the substrate conveyed to the print position. In FIG. 3 and FIG. 5, a mask plate 32 held by a mask holder (omitted from the drawings) is stretched over a mask frame 31. A pattern aperture 32a is made in the mask plate 32 in correspondence with a print area of the substrate 4. The squeegee unit 33 is placed above the mask plate 32 so as to be movable by the squeegee moving mechanism 37.

The squeegee unit 33 has a structure in which two squeegee elevation mechanisms 35 that move a pair of mutually-opposed squeegees 36 up and down are disposed on a horizontal moving plate 34. The squeegee unit 33 is horizontally moved in forward and backward directions along the Y direction by means of the squeegee moving mechanism 37 structured by screw-engaging a feed screw 37b, which is rotationally actuated by a squeegee moving motor 37a, to a nut member 37c fastened to a lower surface of the moving plate 34. In relation to the first individual printing mechanism 8A and the second individual printing mechanism 8B, the mask plate 32, the moving plate 34, and the squeegee moving mechanism 37, all of which belong to the first individual printing mechanism 8A, are omitted from FIG. 3.

As shown in FIG. 3, a head X axis table 40X that is moved in the direction Y by a head Y axis table 40Y is placed above the substrate positioning unit 21. The head X axis table 40X is equipped with a camera head unit 38 and a mask cleaning unit 39. The camera head unit 38 has a substrate recognition camera 38a for capturing an image of the substrate 4 from above and a mask recognition camera 38b for capturing an image of the mask plate 32 from its lower surface side. The mask cleaning unit 39 is equipped with a cleaning head for cleaning the lower surface of the mask plate 32.

The camera head unit 38 and the mask cleaning unit 39 are horizontally moved by actuation of the head X axis table 40X and the head Y axis table 40Y, whereby both the substrate 4

Further, when necessary, the lower surface of the mask plate and the mask plate 32 can be simultaneously recognized. 32 can be cleaned. When these operations are not performed, the camera head unit 38 and the mask cleaning unit 39 are situated at positions laterally receded from a space above the substrate positioning unit 21.

Printing operation of the first individual printing mechanism 8A and printing operation of the second individual printing mechanism 8B are now described. The substrate transport conveyors 28 first carry the substrate 4 subject to printing to the print position and places the substrate in position with respect to the substrate lower support unit 27. The second Z axis table 26 is actuated to move the substrate lower support unit 27 up, to thus support the lower surface of the substrate 4 from below. The substrate positioning unit 21 is subsequently actuated, thereby positioning the substrate 4 with respect to the mask plate 32. The first Z axis table 25 is actuated to move the substrate 4 up in conjunction with the substrate transport conveyors 28, thereby bringing the substrate into contact with the lower surface of the mask plate 32 having the pattern aperture 32a.

Subsequently, the substrate 4 is clamped by the clamping mechanism 29, whereby a horizontal position of the substrate 4 is fixed. One of the two squeegees 36 is lowered in this state, to thus come into contact with the mask plate 32. The squeegee 36 is slidably moved in a squeeging direction (the direction Y) over the mask plate 32 supplied with paste, such as cream solder, whereby the paste is printed on the substrate 4 by way of the pattern aperture 32a. After having undergone printing, the substrate 4 is lowered along with the substrate transport conveyors 28, to thus be separated from the lower surface of the mask plate 32. Further, after having been released from a clamped state by the clamping mechanism 29, the substrate is carried downstream by the substrate transport conveyors 28.

Downward carrying of the substrate 4 subsequent to printing operation is carried out by way of the substrate sorter M3. As shown in FIG. 3, the first substrate sorting conveyor 10A received the printed substrate 4 from the first individual printing mechanism 8A is at this time moved in the direction Y up to a location where the first substrate sorting conveyor comes into alignment with a first substrate conveyance mechanism 12A of the coating and inspection machine M4. The substrate 4 is thereby sent to the first substrate conveyance mechanism 12A and can be conveyed along the first individual mounting lane L1 shown in FIG. 1 (see an arrow C1). Further, the first substrate sorting conveyor 10A received the printed substrate 4 from the substrate transport conveyors 28 of the first individual printing mechanism 8A is moved in the direction Y up to a location where the first substrate sorting conveyor comes into alignment with the second substrate conveyance mechanism 12B of the coating and inspection machine M4. The substrate 4 is thereby sent to the second substrate conveyance mechanism 12B and can be carried along the second individual mounting lane L2 shown in FIG. 1 (an arrow C2). Even in the case of the substrate 4 printed by the second individual printing mechanism 8B, it is likewise possible to select, as a destination of delivery, the first substrate conveyance mechanism 12A or the second substrate conveyance mechanism 12B.

Specifically, in the electronic component mounting line 1, it is possible for the substrate sorter M3 to arbitrarily select a substrate sorting pattern for sorting the substrates 4 subjected to printing operation performed by the first individual printing mechanism 8A and the second individual printing mechanism 8B to either the first substrate conveyance mechanism 12A or the second substrate conveyance mechanism 12B. The substrate 4 sorted to the first substrate conveyance mechanism 12A is carried along the first individual mounting lane L1, and the substrate 4 sorted to the second substrate conveyance mechanism 12B is carried along the second individual mounting lane L2. The substrates are then carried in the substrate conveyance mechanisms provided in a component loading unit subsequent to the electronic component loader M5. Therefore, the substrate sorter M3 works as a substrate sorting unit capable of sorting printed substrates carried from the first individual printing mechanism 8A and the second individual printing mechanism 8B that are a plurality of individual printing mechanisms to a plurality of substrate conveyance mechanisms provided in the component loading unit, according to an arbitrary substrate sorting pattern.

When a type of a substrate is switched, a tooling change, such as a mask replacement operation for replacing the mask plates 32 employed in each of the first individual printing mechanism 8A and the second individual printing mechanism 8B with a mask plate of a type commensurate with a target substrate type and width control operation for adjusting a conveyance width of the substrate transport conveyors 28 to a width of the target substrate, is performed as required during the printing operation. The first individual printing mechanism 8A and the second individual printing mechanism 8B are configured such that the substrate 4 can be individually fed to each of the printing mechanisms and also individually carry out the printed substrates 4; and hence can perform printing operation independently of each other. The tooling change can also be carried out solely without regard to an operating state of the other individual printing mechanism. Specifically, the screen printer M2 has a structure including a plurality of individual printing mechanisms (the first individual printing mechanism 8A and the second individual printing mechanism 8B) that can independently perform printing operation while individually controlled and that enable separate performance of a tooling change incidental to switching of a type of a substrate subject to printing.

A structure of the coating and inspection machine M4 is described by reference to FIGS. 2 and 6. FIG. 6 shows a cross section taken along line B-B shown in FIG. 2. The first substrate conveyance mechanism 12A and the second substrate conveyance mechanism 12B are placed in the X direction at a center area of the upper surface of a base 11. The first substrate conveyance mechanism 12A and the second substrate conveyance mechanism 12B carry the printed substrates 4, which have been carried out from the first individual printing mechanism 8A and the second individual printing mechanism 8B of the screen printer M2 and delivered by way of the substrate sorter M3, and position and hold the thus-conveyed substrates at respective working positions in the coating and inspection machine M4.

A Y axis moving table 13 is placed in the Y direction at a downstream end of the upper surface of the base 11 along the X direction. The Y axis moving table 13 is equipped with a first X axis moving table 14A and a second X axis moving table 14B. As shown in FIG. 6, the first X axis moving table 14A and the second X axis moving table 14B are slidable in the Y direction along guide rails 13a laid on a side surface of the Y axis moving table 13 and actuated in the Y direction by means of a linear motor mechanism incorporated in the Y axis moving table 13. Each of the first X axis moving table 14A and the second X axis moving table 14B is equipped with a coating head 15 and an inspection head 16 by way of an X axis movable attachment base. The coating heads 15 and the inspection heads 16 are respectively actuated in the X direction by means of corresponding linear motors incorporated respectively in the first X axis moving table 14A and the second X axis moving table 14B. The Y axis moving table 13, the first X axis moving table 14A, and the second X axis moving table 14B work as a head moving mechanism for moving the coating heads 15 and the inspection heads 16.

The coating head 15 has a structure in which a dispenser 15b is held by a vertical base 15a so as to be vertically movable, and the dispenser 15b has a function of squirting a resin adhesive for use in bonding an electronic component from a nozzle 15c attached to a lower portion of the dispenser. By means of the head moving mechanisms, the coating head 15 is moved to a position above the substrate 4 held by the first substrate conveyance mechanism 12A and another position above the substrate 4 held by the second substrate conveyance mechanism 12B, whereby arbitrary resin coating points on the respective substrates 4 can be coated with the resin adhesive.

A sacrificial overspray unit 17A used in conjunction with the coating head 15 is arranged beside the first substrate conveyance mechanism 12A. The coating head 15 is moved to a position above the sacrificial overspray unit 17A, and the dispenser 15b is lowered to the sacrificial overspray unit 17A. A trial spray for checking a squirted state of a resin adhesive and a sacrificial overspray for eliminating an unwanted resin adhesive adhered to the nozzle 15c are thereby performed.

The inspection head 16 has a built-in imaging device for capturing an image of the substrate 4 subject to inspection. By means of the head moving mechanisms, the inspection head 16 is moved to a position above the substrate 4 held by the first substrate conveyance mechanism 12A and a position above the substrate held by the second substrate conveyance mechanism 12B, thereby capturing an image of the substrate 4 subject to inspection. A carriage 18 joined to the base 11 from sideways has a built-in recognition processing unit 18a. An image captured by the inspection head 16 is subjected to recognition processing by the recognition processing unit 18a, whereby inspection is conducted for predetermined inspection items by means of image recognition. A calibration unit 17B is provided beside the second substrate conveyance mechanism 12B. The inspection head 16 is moved over the calibration unit 17B, to thus capture an image of the calibration unit 17B, whereby an imaging state achieved during acquisition of an image by the inspection head 16 is calibrated.

Working operation performed by the coating and inspection machine M4 is now described by reference to FIG. 7. In FIG. 7(a), the first substrate conveyance mechanism 12A holds the substrate 4, and the second substrate conveyance mechanism 12B also holds another substrate 4. First, the substrate 4 held by the first substrate conveyance mechanism 12A is herein taken as a target of inspection. The inspection head 16 moves to a position above the substrate 4 and captures an image of a position on the substrate 4 that is an inspection target. Next, as shown in FIG. 7(b), the inspection head 16 is receded from the position above the substrate 4 that is the inspection target, whereupon the coating head 15 is caused to advance to the position above the substrate 4. The dispenser 15b is then lowered, and the nozzle 15c coats a coating point on the upper surface of the substrate 4 with a resin adhesive 19.

Subsequently, after the coating head 15 has been receded from the position above the substrate 4, the inspection head 16 is again caused to advance to the position above the substrate 4 in FIG. 7(c), thereby capturing an image of the substrate 4 coated with the resin adhesive 19. Results of photographing operation are subjected to recognition processing performed by the recognition processing unit 18a, whereby pre-coating inspection for inspecting the state of the substrate 4 achieved before resin coating and post-coating inspection intended for the state of the substrate achieved after resin coating are carried out. At this time, coating operation and inspection processing can be completed without movement of the substrate 4 during the pre-coating inspection, the coating operation, and the post-coating inspection. The coating and inspection machine M4 has various inspection modes. As shown in FIG. 7, there may also be adopted a mode for conducting only the pre-coating inspection or the post-coating inspection other than the mode for carrying out both the pre-coating inspection and the post-coating inspection.

Figure 7:
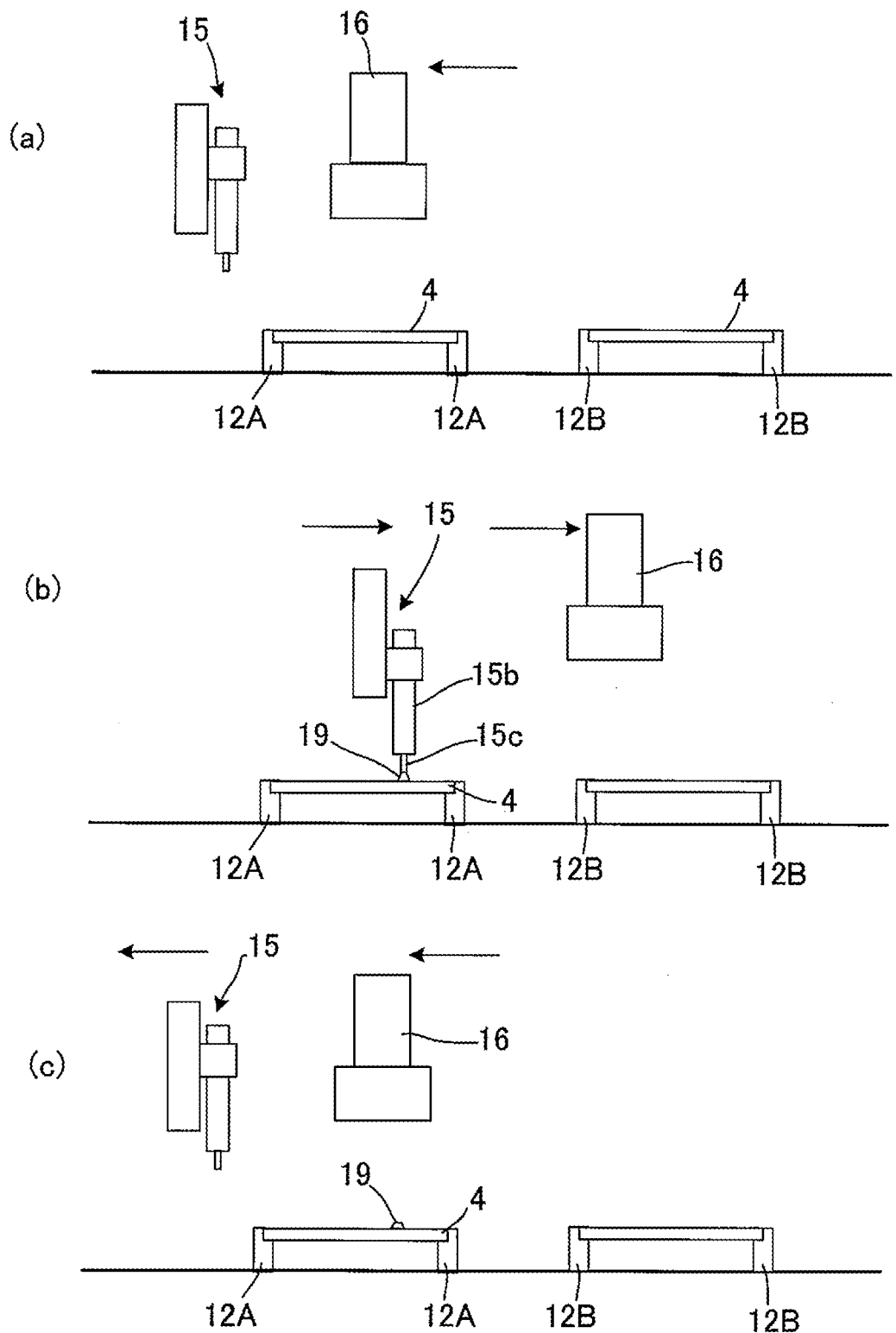
FIG. 7 Drawings (a) to (c) are descriptive operation diagrams of the coating and inspection machine in the electronic component mounting system of the embodiment of the present invention.

The exemplification shown in FIG. 7 illustrates example coating operation and example inspection operation targeted solely for the substrate 4 held by the first substrate conveyance mechanism 12A. However, when both the target substrates 4 are simultaneously held by the first substrate conveyance mechanism 12A and the second substrate conveyance mechanism 12B, the two substrates 4 become targets for coating operation and inspection operation. In this case, there is used an operation pattern that enables most efficient performance of coating operation and inspection operation for the two substrates 4.

In the structure of the coating and inspection machine M4, the first substrate conveyance mechanism 12A and the second substrate conveyance mechanism 12B act as a plurality of substrate conveyance mechanisms that are provided in the substrate sorter M3 belonging to the coating and inspection unit and that convey the respective printed substrates 4 carried out from the plurality of individual printing mechanisms of the screen printer M2. The Y axis moving table 13, the first X axis moving table 14A, and the coating head 15 make up a coating operation mechanism that subjects a plurality of substrates conveyed by the plurality of substrate conveyance mechanisms to resin coating operation.

The Y axis moving table 13, the second X axis moving table 14B, the inspection head 16, and the recognition processing unit 18a make up an inspection processing unit that performs pre-coating inspection before the substrate 4 undergoes coating operation performed by the coating head 15 and/or post-coating inspection after the substrate 4 has undergone coating operation. As mentioned above, the coating and inspection machine M4 is structured by combination of the coating operation mechanism and the inspection processing unit with the plurality of substrate conveyance mechanisms. Two functions can compactly be incorporated into a space of a single machine in the electronic component mounting line 1 having the plurality of individual mounting lanes.

Structures of the electronic component loader M5 to the loading and inspection machine M8 are now described by reference to FIGS. 8, 9, and 10. FIG. 9 shows a cross section taken along line C-C shown in FIG. 8, and FIG. 10 shows a cross section taken along line D-D shown in the same drawing. Since the electronic component loaders M5, M6, and M7 have the same structure, reference numerals and explanations are given solely to the electronic component loader M5. In FIGS. 8 and 9, a first substrate conveyance mechanism 42A and a second substrate conveyance mechanism 42B are disposed at a center area on an upper surface of a base 41 along the X direction. The first substrate conveyance mechanism 42A carries the coated and inspected substrate 4 carried out of the first substrate conveyance mechanism 12A of the coating and inspection machine M4 and positions and holds the substrate at respective working positions for the electronic component loaders M5, M6, and M7. The second substrate conveyance mechanism 42B carries the coated and inspected substrate 4 carried out of the second substrate conveyance mechanism 12B of the coating and inspection machine M4 and positions and holds the substrate at respective working positions for the electronic component loaders M5, M6, and M7.

Carriages 49 equipped with a plurality of tape feeders 50 are arranged on both sides of the base 41. In each of the carriages 49, a tape feed reel 49a that houses a coiled carrier tape T holding electronic components subject to mounting is set on each of the tape feeders 50. The tape feeder 50 pitch-feeds the carrier tape T withdrawn from the tape feed reel 49a, thereby feeding electronic components to pickup positions for the component loading mechanisms to be described below.

A Y axis moving table 43 is arranged in the Y direction at the downstream end of the upper surface of the base 41 in the X direction. The Y axis moving table 43 is equipped with a first X axis moving table 44A and a second X axis moving table 44B. As shown in FIG. 9, the first X axis moving table 44A and the second X axis moving table 44B are slidable in the Y direction along guide rails 43a laid on a side surface of the Y axis moving table 43 and are actuated in the Y direction by means of a linear motor mechanism incorporated in the Y axis moving table 43. The first X axis moving table 44A is equipped with a first loading head 45A by way of the X axis movable attachment base, and the second X axis moving table 44B is equipped with a second loading head 45B by way of the same. The first loading head 45A is actuated in the X direction by a linear motor mechanism incorporated in the first X axis moving table 44A, and the second loading head 45B is actuated in the X direction by a linear motor mechanism incorporated in the second X axis moving table 44B. The Y axis moving table 43, the first X axis moving table 44A, and the second X axis moving table 44B make up a head moving mechanism for moving the first loading head 45A and the second loading head 45B.

Each of the first loading head 45A and the second loading head 45B has a structure in which a plurality of suction nozzles 45a are removably attached to a lower portion of the loading head. The first loading head and the second loading head are moved by means of the head moving mechanism, and electronic components are taken out of the respective tape feeders 50 by means of the corresponding suction nozzles 45a. The thus-picked electronic components are moved to and loaded on the respective substrates 4. The first loading head 45A, the second loading head 45B, and the head moving mechanism make up a plurality of component loading mechanisms (a first component loading mechanism 46A and a second component loading mechanism 46B) that subject the plurality of substrates 4 carried by the first substrate conveyance mechanism 42A and the second substrate conveyance mechanism 42B to component loading operation.

A first component recognition camera 47A and a first nozzle housing unit 48A are interposed between the first substrate conveyance mechanism 42A and the corresponding tape feeder 50. A second component recognition camera 48A and a second nozzle housing unit 48B are interposed between the second substrate conveyance mechanism 42B and the corresponding tape feeder 50. The first component recognition camera 47A is situated at any position along a travel path of the first loading head 45A and captures an image of an electronic component held by the first loading head 45A from below. The second component recognition camera 47B is situated at any position along a travel path of the second loading head 45B and captures an image of an electronic component held by the second loading head 45B from below. A positional displacement of the electronic component held by the first loading head 45A and a positional displacement of the electronic component held by the second loading head 45B are detected by subjecting results of photographing operation to recognition processing.

The first nozzle housing unit 48A houses a plurality of types of suction nozzles 45a to be attached to the first loading head 45A according to types of electronic components. The second nozzle housing unit 48B houses a plurality of types of suction nozzles 45a to be attached to the second loading head 45B according to types of electronic components. The first loading head 45A approaches the first nozzle housing unit 48A to perform nozzle replacement operation, whereby the suction nozzles 45a attached to the first load head 45A are replaced according to a type of a target electronic component. The second loading head 45B approaches the second nozzle housing unit 48B to perform nozzle replacement operation, whereby the suction nozzles 45a attached to the second load head 45B are replaced according to a type of a target electronic component.

Specifically, the component loading unit including the electronic component loaders M5, M6, and M7 is equipped with the plurality of substrate conveyance mechanisms (the first substrate conveyance mechanism 12A and the second substrate conveyance mechanism 12B) that each carry the substrate 4 sorted by the substrate sorter M3 (the substrate sorting unit) and delivered from the coating and inspection machine M4 and the plurality of component loading mechanisms (the first component loading mechanism 46A and the second component loading mechanism 46B) that subject the plurality of respective substrates 4 carried by the plurality of substrate conveyance mechanisms to component loading operation.

A structure of the loading and inspection machine M8 is now described by reference to FIG. 10. A first substrate conveyance mechanism 52A and a second substrate conveyance mechanism 52B are arranged at a center area on an upper surface of a base 51 in the X direction. The first substrate conveyance mechanism 52A carries the substrate 4 equipped with the components and carried out of the first substrate conveyance mechanism 42A of the electronic component loader M7 and positions and holds the substrate at a working position for the loading and inspection machine M8. The second substrate conveyance mechanism 52B carries the substrate 4 equipped with the components and carried out of the second substrate conveyance mechanism 42B of the electronic component loader M7 and positions and holds the substrate at a working position for the loading and inspection machine M8. The carriage 18 shown in FIG. 6 is situated on one side of the base 51, and the carriage 49 shown in FIG. 9 is situated on the other side of the same.

A Y axis moving table 53 is arranged in the Y direction at the downstream end of the upper surface of the base 51 in the X direction. The Y axis moving table 53 is equipped with a first X axis moving table 54A and a second X axis moving table 54B. The first X axis moving table 54A and the second X axis moving table 54B are slidable in the Y direction along guide rails 53a laid on a side surface of the Y axis moving table 53 and are actuated in the Y direction by means of a linear motor mechanism incorporated in the Y axis moving table 53. Each of the first X axis moving table 54A and the second X axis moving table 54B is equipped with the inspection head 16 and a loading head 55 by way of the X axis movable attachment base. The inspection head 16 and the loading head 55 are actuated in the X direction by a linear motor mechanism incorporated in each of the first X axis moving table 54A and the second loading head 54B. The Y axis moving table 53, the first X axis moving table 54A, and the second X axis moving table 54B make up a head moving mechanism for moving the inspection head 16 and the loading head 55.

The loading head 55 has a structure in which a plurality of suction nozzles 55a are removably attached to a lower portion of the loading head. As in the case of the first loading head 45A and the second loading head 45B of the electronic component loaders M5, M6, and M7, the loading head 55 is moved by the head moving mechanism, to thus transport and mount electronic components taken out of the tape feeder 50 to and on the respective substrates 4 conveyed by the first substrate conveyance mechanism 52A and the second substrate conveyance mechanism 52B. The loading head 55 and the head moving mechanism make up a component loading mechanism 56 that subjects each of the plurality of substrates 4, which are conveyed by the first substrate conveyance mechanism 52A and the second substrate conveyance mechanism 52B, to component loading operation. The inspection head 16 has the same function as that of the inspection head 16 shown in FIG. 16 and captures images of the component-loaded substrates 4 conveyed by the first substrate conveyance mechanism 52A and the second substrate conveyance mechanism 52B. The recognition unit 18a subjects results of photographing operation to recognition processing, thereby performing post-loading inspection for determining whether or not a loaded state of electronic components on the substrate 4 is defective.

In the configuration of the electronic component mounting line 1, a conveyance lane made by linking together the substrate transport conveyors 28 of the first individual printing mechanism 8A in the screen printer M2, the first substrate conveyance mechanism 12A in the coating and inspection machine M4, the first substrate conveyance mechanism 42A in the electronic component loader M5 to the loading and inspection machine M8, and the first substrate conveyance mechanism 52A in the loading and inspection machine M8 makes up a first conveyance lane. Further, the first conveyance lane, the first individual printing mechanism 8A in the screen printer M2, and the first component loading mechanism 46A in the electronic component loaders M5, M6, and M7 are combined together, to thus make up the first individual mounting lane L1 shown in FIG. 1.

Likewise, a conveyance lane made by linking together the substrate transport conveyors 28 of the second individual printing mechanism 8B in the screen printer M2, the second substrate conveyance mechanism 12B in the coating and inspection machine M4, the second substrate conveyance mechanism 42B in the electronic component loaders M5, M6, and M7, and the second substrate conveyance mechanism 52B in the loading and inspection machine M8 makes up a second conveyance lane. Further, the second conveyance lane, the second individual printing mechanism 8B in the screen printer M2, and the second component loading mechanism 46B in the electronic component loaders M5, M6, and M7 are combined together, to thus make up the second individual mounting lane L2 shown in FIG. 1.

By reference to FIG. 11, a structure of a control system of the electronic component mounting line 1 is now described. In FIG. 11, the host computer 3 has a mode command unit 60, a control unit 61, a communication unit 62, a storage unit 63, an operation and input unit 64, and a display unit 65. In plural substrate mounting operation for performing work for concurrently mounting components on a plurality of substrates by activating the first individual mounting lane L1 and the second individual mounting lane L2, the mode command unit 60 issues, as a command, a work mode representing a mode of component mounting operation to be carried out by the individual mounting lanes. The mode command unit 60 selectively issues as a command a first work mode 66a and a second work mode, which will be described below, according to whether or not a type of a substrate is switched.

The control unit 61 controls, in a centralized manner, working operations performed by the screen printer M2, the substrate sorter M3, the coating and inspection machine M4, the electronic component loaders M5, M6, and M7, and the loading and inspection machine M8. The control unit 61 controls the machines according to a work mode commanded by the mode command unit 60.

The communication unit 62 exchanges signals with the substrate feeder M1 to the substrate recovery machine M10 making up the electronic component mounting line 1, by way of a LAN system 2. The storage unit 63 stores information about the work mode as well as data, programs, and the like, required for the respective machines of the electronic component mounting line 1 to subject a type of a target substrate to working operation. Specifically, the storage unit 63 includes a work mode storage unit 66, and a first work mode 66a and a second work mode 66b stored in the work mode storage unit 66.

The first work mode 66a is a mode for causing the first individual mounting lane L1 and the second individual mounting lane L2 to continually subject a single type of a substrate to component mounting operation without performance of a tooling change incidental to switching of a substrate type. The second work mode 66b is a mode for causing one individual mounting lane to intermittently subject a plurality of types of substrates to component mounting operation while iterating a tooling change in the individual printing mechanism of the individual mounting lane every time a plurality of substrates are switched. The second work mode includes both a case where only the first individual mounting lane L1 or the second individual mounting lane L2 switches a substrate type and another case where both the first individual mounting lane L1 and the second individual mounting lane L2 switch substrate types.

The operation and input unit 64 is an input device, such as a touch panel, by way of which a line manager who manages the electronic component mounting line 1 inputs various types of operation commands. The operation commands include the foregoing work mode command. Specifically, the line manager inputs a work mode command by way of the operation and input unit 64, whereby the mode command unit 60 commands a work mode. The display unit 65 is a display panel, such as a liquid crystal panel, and displays a guide screen at the time of input of an operation command, a command for a tooling change command required at the time of switching of a substrate type, and the like.

By reference to FIG. 12, FIG. 13, and FIG. 14, the component mounting operation performed by the electronic component mounting line 1 is described. The component mounting operation described herein shows plural substrate mounting operation. Namely, the substrates 4 are conveyed by activating the first individual mounting lane L1 and the second individual mounting lane L2; namely, the substrate conveyance mechanisms belonging respectively to the first individual mounting lane L1 and the second individual mounting lane L2, and the plurality of substrates 4 are concurrently subjected to component mounting operation by means of a work mechanism, such as the component loading mechanisms commensurate with the substrate conveyance mechanisms.

Plural substrate mounting operation performed in accordance with the first work mode is first described by reference to FIG. 12. An example provided herein shows that the first individual mounting lane L1 continually subjects a single substrate type (a substrate 4A) to component mounting operation and that the second individual mounting lane L2 continually subjects another single substrate type (a substrate 4B) t component mounting operation. Specifically, in the first individual mounting lane L1, the substrate 4A is fed from the substrate feeder M1 to the first individual printing mechanism 8A of the screen printer M2 and to thus undergo printing operation. The printed substrate 4A is carried into the coating and inspection machine M4 by way of the substrate sorter M3, and coating and inspection of a resin adhesive are carried out.

Next, the substrate 4A is carried into the electronic component loader M5, where the first component loading mechanism 46A subjects the substrate 4A to component loading operation. During the course of the substrate 4A being sequentially conveyed further downstream, the electronic component loaders M6 and M7 also subject the substrate 4A to component loading operation in the same manner. Next, after subjected to the component loading operation performed by the component loading mechanism 56 and the post-loading inspection performed by the inspection head 16, the substrate 4A conveyed into the loading and inspection machine M8 is carried into the reflow machine M9, where the substrate undergoes solder bonding.

Even in the second individual mounting lane L2, component mounting operation is continually performed for the substrate 4B in the same manner as described in connection with the above example. In the first work mode, component mounting operation is continually performed for a single substrate type without performance of tooling change operation. Therefore, high production efficiency can be accomplished, and therefore the work mode is suitable for a production style requiring mass production. The example provided herein shows that the first individual mounting lane L1 and the second individual mounting lane L2 are targeted respectively for different types of substrates (the substrate 4A and the substrate 4B). However, when a large production volume of one substrate type is sought, a single type of a substrate (for instance, the substrate 4A) may be input to both the first individual mounting lane L1 and the second individual mounting lane L2.

Plural substrate mounting operation performed in the second work mode is now described by reference to FIG. 13. The second work mode is for letting either the first individual mounting lane L1 or the second individual mounting lane L2 or both of them intermittently subject a plurality of substrate types to component mounting operation while repeatedly performing tooling change operation every time a substrate type is switched. An example described herein shows that the first individual mounting lane L1 continually subjects a single substrate type to component mounting operation and that the second individual mounting lane L2 intermittently subjects a plurality of substrate types to component mounting operation while the individual printing mechanism of the individual mounting lane is repeatedly performing a tooling change operation.

Specifically, the first individual mounting lane L1 continually subjects the substrate type, or the substrate 4A, to component mounting operation as in the first work mode shown in FIG. 12. On the contrary, the second individual mounting lane L2 switches the substrate type to another substrate type, or a substrate 4D, after having subjected a substrate type, or a substrate 4C, to component mounting operation by an amount corresponding to a scheduled production volume (three in the embodiment). Namely, in the second work mode shown in FIG. 13, component mounting operation targeted for a plurality of types of substrates in one individual mounting lane (the second individual mounting lane L2 in the embodiment) and another component mounting operation targeted for a single substrate type in the other individual mounting lane (the first individual mounting lane L1) are concurrently performed. The second work mode is suitable for a case where a larger production volume of one substrate type (the substrate 4A in the embodiment) is sought as compared with another substrate type in connection with a production style for subjecting a plurality of substrate types to component mounting operation.

In this case; however, output of a printed substrate from the second individual printing mechanism 8B is interrupted during performance of tooling change operation, such as switching of a mask plate, incidental to switching of a substrate type for the second individual printing mechanism 8B in the screen printer M2. Consequently, as shown in FIG. 13, a "substrate wait state" where a substrate subject to operation is not present arises in some of the machines in the second individual mounting lane L2. When such a "substrate wait state" occurs with a high frequency, an actual availability factor of the entire mounting line decreases, thereby impairing productivity of a facility. Therefore, it is desirable to prevent occurrence of deterioration of the actual availability factor as much as possible.

In such a case, a method, such as that shown in FIG. 14, can be used on occasion of performance of component mounting operation in the second work mode. During the course of the screen printing machine M2 performing tooling change operation for the second individual printing mechanism 8B, the substrate 4A printed by the first individual printing mechanism 8A may also be delivered to the second individual mounting lane L2 as well as to the first individual mounting lane L1 when delivered to the coating and inspection machine M4. Specifically, the substrate 4A is delivered to the second substrate conveyance mechanism 12B as well as to the first substrate conveyance mechanism 12A by means of a substrate sorting function (see FIG. 3) of the substrate sorter M3 (see arrows C1 and C2). The printed substrate 4A is thereby fed to the second individual mounting lane L2, as well. The substrate 4A is carried into the substrate conveyance mechanism (the substrate conveyance mechanism of the electronic component loader M5 in the embodiment) belonging to the second individual mounting lane L2 waiting for a substrate, among the electronic component loaders M5, M6, and M7. The substrate 4A is subjected to component loading operation by means of a corresponding component loading mechanism.

In an example shown in FIG. 14, in the second work mode, tooling change operation is performed in an individual printing mechanism (the second individual printing mechanism 8B) belonging to one individual mounting lane (the second individual mounting lane L2). In the middle of performance of tooling change operation, the substrate sorting unit (the substrate sorter M3) carries a substrate printed by the individual printing mechanism (the first individual printing mechanism 8A) belonging to another individual mounting lane (the first individual mounting lane L1) into the substrate conveyance mechanism belonging to the one individual mounting lane of the component loaders (the electronic component loaders M5, M6, and M7), thereby performing component loading operation.

Occurrence of a substrate wait state incidental to switching of a substrate type is minimized, so that deterioration of the actual availability factor can be prevented. However, this is based on the premise that a takt time consumed by printing operation of the first individual printing mechanism 8A is shorter than a takt time consumed by component loading operation performed by the component loading mechanisms of the downstream electronic component loaders M5, M6, and M7, and that processing ability of the first individual printing mechanism 8A has an allowance.

As described above, the present invention is directed toward an electronic component mounting system built by linking a screen printing unit having a plurality of individual printing mechanisms to an upstream side of a component loading unit having a plurality of substrate conveyance mechanisms. With regard to plural substrate mounting operation for activating a plurality of individual mounting lanes, to thus concurrently subject a plurality of substrates to component mounting operation, the system is configured so as to selectively command a first work mode for fixing substrate types in all of the individual mounting lanes and continually performing component mounting operation and a second work mode for intermittently performing component mounting operation while tooling change operation is repeatedly performed in an individual printing mechanism every time a plurality of substrate types are switched in one individual mounting lane. It thereby becomes possible for a single electronic component mounting line to select, as required, an appropriate production style from mass production of one type of product and producing multiple products in small quantities. Thus, accomplishment of both high productivity and a capability of addressing production of multiple products becomes feasible.

The present invention is not limited to the examples described in connection with the embodiment and is also scheduled to be susceptible to alterations or applications conceived by those who are skilled in the art on the basis of descriptions of the specification and well-known techniques. These alterations or applications shall fall within a scope where protection of the invention is sought. The respective constituent elements of the embodiment can also be combined arbitrarily without departing a scope of the gist of the invention.

The present patent application is based on Japanese Patent Application (JP-A-2008-258142) filed on Oct. 3, 2008, the entire subject matter of which is incorporated herein by reference.

INDUSTRIAL APPLICABILITY

An electronic component mounting system and an electronic component mounting method of the present invention yield an advantage of the ability to concurrently, efficiently subject a plurality of substrates to component mounting operation and are useful for an electronic component mounting field where a mounting substrate is manufactured by mounting electronic components on a substrate.

DESCRIPTIONS OF THE REFERENCE NUMERALS AND SYMBOLS

1 ELECTRONIC COMPONENT MOUNTING LINE (ELECTRONIC COMPONENT MOUNTING SYSTEM)
4, 4A, 4B, 4C, 4D SUBSTRATE
8A FIRST INDIVIDUAL PRINTING MECHANISM
8B SECOND INDIVIDUAL PRINTING MECHANISM
10A FIRST SUBSTRATE SORTING CONVEYOR
10B SECOND SUBSTRATE SORTING CONVEYOR
12A FIRST SUBSTRATE CONVEYANCE MECHANISM
12B SECOND SUBSTRATE CONVEYANCE MECHANISM

15 COATING HEAD
16 INSPECTION HEAD
46A FIRST COMPONENT LOADING MECHANISM
46B SECOND COMPONENT LOADING MECHANISM
M1 SUBSTRATE FEEDER
M2 SCREEN PRINTER
M3 SUBSTRATE SORTER
M4 COATING AND INSPECTION MACHINE
M5, M6, M7 ELECTRONIC COMPONENT LOADER
M8 LOADING AND INSPECTION MACHINE
M9 REFLOW MACHINE
M10 SUBSTRATE RECOVERY MACHINE

The invention claimed is:

1. An electronic component mounting system including, on an upstream side of a component loading unit for loading electronic components on a substrate, a screen printing unit for printing paste for use in bonding the electronic components on the substrate and a coating unit that applies a coat of resin for use in bonding electronic components, the system comprising:
   a plurality of individual printing mechanisms that are provided in the screen printing unit, that can independently perform printing operation under separate control, and that can separately perform tooling change operation incidental to switching of a type of a substrate subject to printing;
   a plurality of printed substrate conveyance mechanisms, and a coating operation mechanism that are provided in the coating unit, the plurality of printed substrate conveyance mechanisms respectively conveying printed substrates carried out of the plurality of individual printing mechanisms, and the coating operation mechanism subjecting the printed substrates conveyed by the plurality of printed substrate conveyance mechanisms to the resin coating operation; and
   a plurality of coated substrate conveyance mechanisms and a plurality of component loading mechanisms that are provided in the component loading unit, the plurality of coated substrate conveyance mechanisms respectively conveying coated substrates delivered from the coating unit and the plurality of component loading mechanisms subjecting the coated substrates conveyed by the plurality of coated substrate conveyance mechanisms to component loading operation, wherein
   a plurality of individual mounting lanes, each of which is built by combination of a corresponding individual printing mechanism of the plurality of individual printing mechanism, a corresponding substrate conveyance mechanism of the plurality of printed substrate conveyance mechanisms and the plurality of coated substrate conveyance mechanisms, and a corresponding component loading mechanism of the plurality of component loading mechanisms, are activated so that a plurality of substrates are concurrently subjected to component mounting operation.

2. The electronic component mounting system according to claim 1, further comprising an inspection machine performing post-loading inspection for determining whether or not a loaded state of the electronic components on the substrate is defective.

* * * * *